United States Patent [19]

Kuninobu et al.

[11] 3,916,428

[45] Oct. 28, 1975

[54] SEMICONDUCTOR MAGNETO-RESISTANCE ELEMENT

[75] Inventors: Shigeo Kuninobu, Kyoto; Shoji Arai, Hirakata, both of Japan

[73] Assignee: Matsushita Electric Industrial Company, Ltd., Kadoma, Japan

[22] Filed: Feb. 13, 1974

[21] Appl. No.: 442,196

[30] Foreign Application Priority Data

| | | |
|---|---|---|
| May 19, 1973 | Japan | 48-55924 |
| May 24, 1973 | Japan | 48-58367 |
| July 5, 1973 | Japan | 48-76291 |
| Aug. 31, 1973 | Japan | 48-98732 |
| Aug. 31, 1973 | Japan | 48-98735 |

[52] U.S. Cl. ........................ 357/27; 357/57; 357/86

[51] Int. Cl.² ..................... H01L 27/22; H01L 29/82

[58] Field of Search ........................... 357/27, 57, 86

[56] References Cited

UNITED STATES PATENTS 3,686,684 8/1974 Matsushita ...................... 317/235 R 3,742,318 6/1973 Yamashita ...................... 317/235 R

*Primary Examiner*—Martin H. Edlow

*Attorney, Agent, or Firm*—Stevens, Davis, Miller & Mosher

[57] ABSTRACT

A semiconductor magneto-resistance element comprising a semiconductor substrate of one conductivity type and high specific resistivity or intrinsic silicon, an injection region of the other conductivity type, a first electrode contacting with said injection region to enable the injection of carriers, a second electrode contacting with said semiconductor substrate in an area substantially equal to or narrower than said injection region, and according to necessity a blocking junction portion of said other conductivity type formed in said semiconductor substrate and contacting with said second electrode. A high sensitivity for a magnetic field and also a negative magnetic field effect due to the negative resistance effect is provided. This element can be easily manufactured by the usual transistor and/or IC techniques.

9 Claims, 17 Drawing Figures

SEMICONDUCTOR MAGNETO-RESISTANCE ELEMENT

BACKGROUND OF THE INVENTION

1. Field of the Invention

This invention relates to a semiconductor magneto-electrical transducer, and more particularly to a magneto-resistance element using thermally non-equilibrium carriers.

2. Description of the Prior Art

Conventionally, there have been known such semiconductor magneto-electrical transducer elements utilizing thermally non-equilibrium carriers as PIN diodes having a magnetic field effect for doubly injected carriers. The PIN diodes include such types of elements as those having a surface roughened by sand-blasting and utilizing surface recombination, those comprising a semiconductor substrate doped with a deep-level-forming impurity, etc. In such elements, however, industrially difficult processes are needed such as the surface treatment and thickness control of the semiconductor substrate about the diffusion length of the carriers in the former, and the control of the concentration of the deep-level-forming impurity in the latter.

SUMMARY OF THE INVENTION

An object of this invention is to provide a semiconductor magneto-resistance element which does not need such processes as special surface treatment, thickness control of the semiconductor substrate, and doping of deep-level-forming impurity in a semiconductor substrate.

Another object of this invention is to provide a semiconductor magneto-resistance element which can be easily manufactured by conventional transistor or IC techniques, i.e., so-called planar techniques, and has a negative resistance characteristics and a high field sensitivity at a low magnetic field.

Still another object of this invention is to provide a semiconductor magneto-resistance element having a negative magnetic field effect.

A further object of this invention is to provide a semiconductor magneto-resistance element having a negative magnetic field effect, and excellent thermal characteristics and linearity.

A still further object of this invention is to provide a semiconductor magneto-resistance element having a high resistance to the external atmosphere and a high reliability.

The semiconductor magneto-resistance element according to this invention has at least one of two features in that it has a high field sensitivity at low magnetic fields of about 1 to 2 KGauss, and has a so-called negative magnetic field effect; i.e., a decrease of the resistance of an element by the application of a magnetic field, according to the orientation. Further, this magneto-resistance element can be easily made by the usual planar techniques and is adapted for mass-production.

DESCRIPTION OF THE PREFERRED EMBODIMENTS

The semiconductor magneto-resistance element according to this invention as well as other objects, features and advantages of this invention will be described in more detail hereinbelow referring to the accompanying drawings.

Figure 1:
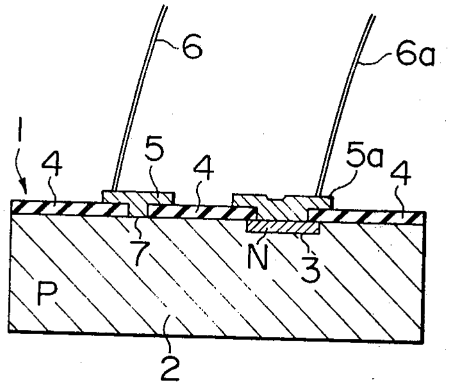
FIG. 1 is an enlarged cross-section of a basic embodiment of a semiconductor magneto-resistance element according to this invention using a p-type semiconductor substrate.

A basic structure is shown in FIG. 1, in which a semiconductor magneto-resistance element 1 comprises a p-type semiconductor substrate 2 of high specific resistivity. An n-type region 3 capable of injecting carriers is formed in a part of the p-type semiconductor substrate 2. This n-type region 3 can be made, for example, by the steps of forming an oxide film 4 on the upper surface of the semiconductor substrate 2, photoetching the film, and diffusing phosphorus, i.e., by the planar method. An open window is formed in the oxide film 4 on the predetermined portion 7 of the semiconductor substrate 2 of high specific resistivity in the neighborhood of the n-type region 3. A metal electrode 5 is provided to ohmically contact the semiconductor substrate 2 through said window. This metal electrode 5 can be formed, for example, by depositing or sputtering aluminum and heat-treating the structure at 500°C for 30 minutes. At the same time with the formation of the metal electrode 5, another metal electrode 5a is formed on the n-type region 3. Lead wires 6 and 6a are connected with these metal electrodes 5 and 5a, respectively.

For enabling the injection of carriers from the n-type region 3, a voltage is applied to the lead wires 6 and 6a, i.e., the lead wire 6 kept positive and another lead wire 6a kept negative. Then, characteristics similar to the usual diode characteristics are provided due to the injection of carriers from the n-type region 3. Such an element has a certain degree of magnetic field sensitivity. The element of FIG. 1 is characterized by the fact that the area of the contact portion of the metal electrode 5 with the substrate 2, i.e., the metal-semiconductor contact portion 7 is made sufficiently small compared with the n-type injection region 3. When a forward voltage is applied to an element of the above structure, concentration of the electric field becomes remarkable in the neighborhood of the metal-semiconductor contact portion 7 and causes the avalanche pheneme-non to take place at the low voltage and current region due to the two facts that carriers are injected from the n-type injection region 3 and that the area of the metal-semiconductor contact region 7 is small. A negative resistance is generated by the conductivity modulation due to this avalanche phenomenon. This negative resistance characteristic depends on the area of the metal-semiconductor contact region 7. When the area is sufficiently small, the negative resistance phenomenon can be generated with a yield of approximately 100 percent and is extremely stable. Due to the negative resistance considered to be generated by said two effects of the injection of carriers from the n-type injection region and the field concentration by the small metal-semiconductor contact, a filament-like current path in the plasma state is formed. Therefore, a magneto-resistance element having a higher sensitivity for a magnetic field than those causing no negative resistance is provided. For example, it was found that, in the elements of the structure shown in FIG. 1 using a p-type semiconductor substrate 2 of a specific resistivity of about 1000 Ω-cm and aluminum metal portions 5 and 5a, when the distance from the n-type region 3 to the metal-semiconductor contact region 7 is 100 μ and the area of the *n*-type region 3 is 300 μ in diameter the negative resistance is not generated if the area of the metal-semiconductor contact region 7 is near that of the n-type region 3, but is generated in a low voltage and low current region to provide a high sensitivity for a magnetic field if the area of the metal-semiconductor contact region 7 is smaller than 50 μ in diameter. Apparently, the breakdown voltage $V_{th}$ and the current $I_{th}$ at said voltage can be selected arbitrarily by changing the valves of the specific resistivity of values substrate 2, the distance from the n-type region 3 to the metal-semiconductor contact region 7, areas of the n-type region 3 and the metal-semiconductor contact region 7, etc.

Conventionally, some PIN diodes using silicon have been known to have a negative resistance. In such diodes, usually a deep-level-forming impurity such as Au, Ni, Zn, etc., is doped and the negative resistance can be generated when such impurity levels are completely occupied. In the element of FIG. 1, however, no doping of such an impurity is done. Further, there is no need for special surface treatment.

Figure 2:
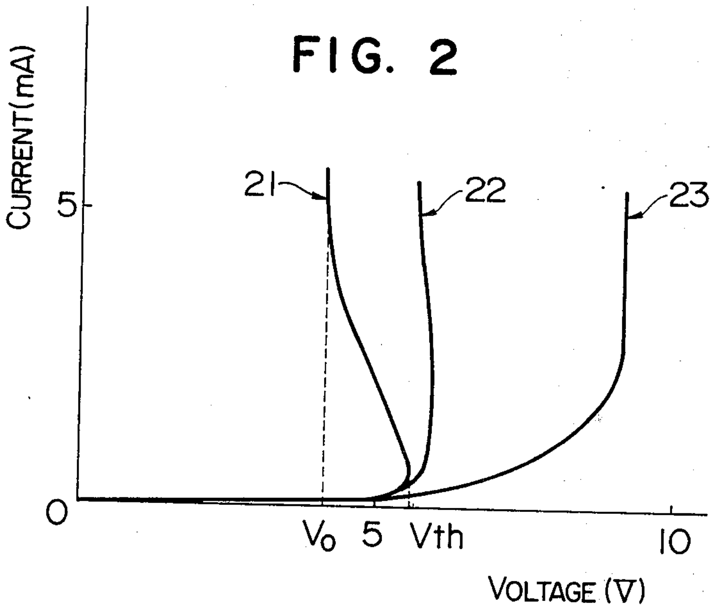
FIG. 2 shows the current vs. voltage characteristic curves of the element of FIG. 1 for several intensities of magnetic field.

As is described above, the negative resistance according to the element of FIG. 1 is considered to arise from the avalanche phenomenon due to the small area of the metal-semiconductor contact and the injection of carriers. As a result, a filament-like current path in the plasma state is formed. A magnetic field works to control this current path. Thus, a high sensitivity for a magnetic field is provided. In the above and the following embodiments, a p-type semiconductor substrate is described but similar effects are also obtained using an n-type substrate. In such a case, a p-type injection region is formed, for example, by doping boron, etc., and a voltage of the opposite polarity is applied to the lead wires. FIG. 2 shows examples of changes in the current vs. voltage characteristics when a magnetic field is applied to the element of FIG. 1 in a direction perpendicular to the drawing sheet and with the upward sense. Magnetic fields perpendicular to the drawing sheet and sensing from the back side to the front side of the sheet will be denoted as $H_+$. In FIG. 2, curves 21, 22 and 23 represent the characteristics under the application of a magnetic field of 0G, 2KG, and 4KG, respectively.

The semiconductor magneto-electrical transducer element of said structure having a high field sensitivity can be easily manufactured by the usual techniques for transistors and IC's. Further, the breakdown voltage can be arbitrarily selected. Therefore, various applications can be expected. Further, since the characteristics of said element exhibit negative resistance, this property can be positively utilized to provide a contactless on-off switch.

Figure 3:
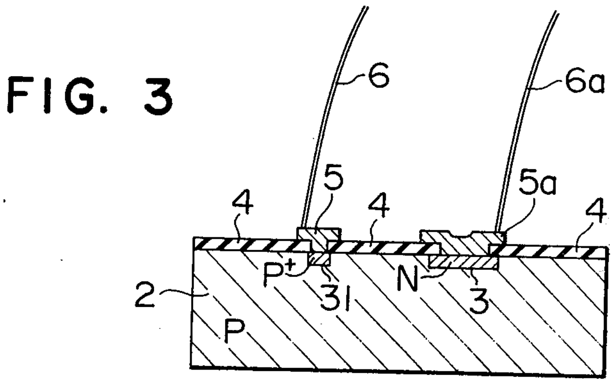
FIG. 3 is an enlarged cross-section of another embodiment of a semiconductor magneto-resistance element according to this invention.

It was also found that the negative resistance is provided when a p-type region 31 of a lower resistivity is formed in the p-type substrate 2 by diffusing an impurity such as boron in the structure of FIG. 1 to avoid the direct contact of the metal electrode 5 and the p-type silicon substrate 2 of high specific resistivity, as illustrated in FIG. 3. The structure of FIG. 3 also provides the negative resistance characteristics and a high field sensitivity. Here, it is to be noted that the carrier concentration in the p-type region 31 should be smaller than that in the n-type injection region 3 for obtaining the negative resistance.

Figure 4:
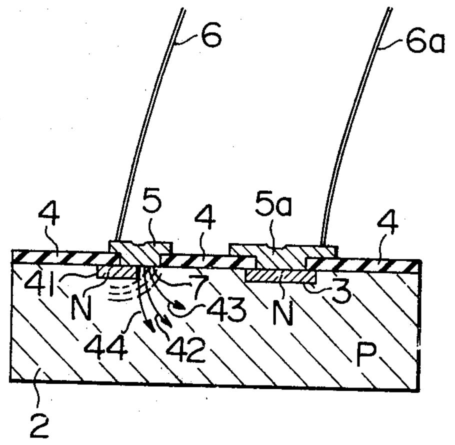
FIG. 4 is an enlarged cross-section of another embodiment of a semiconductor magneto-resistance element according to this invention.

FIG. 4 shows another embodiment of the semiconductor magneto-resistance transducer element according to this invention, in which an n-type region 41 is added to the structure of FIG. 1. As is described above, the area of the metal-semiconductor contact region 7 plays an important role in the element of FIG. 1. The value of $V_{th}$ or $V_o$ can be fairly well controlled when the area is precisely controlled. However, because of the limitation concerning the photoetching of the oxide film 4, etc., the minimum area for the metal-semiconductor contact 7 is limited to about 10 μ in diameter. Further, it is not easy to achieve this value with good reproducibility. This problem is improved in the embodiment of FIG. 4. In FIG. 4, a metal electrode 5 directly contacts with not only the semiconductor substrate 2 but also an n-type region 41 formed by diffusing phosphorus, etc. in the substrate through an open hole made in the oxide film 4.

When a voltage is applied to the element of FIG. 4 similar to the case of FIG. 1 so that carriers are injected from the n-type region 3, the n-type region 41 is reversely biased with respect to the substrate 2. Since the specific resistivity of the substrate 2 is high, a depletion layer extends deeply into the substrate 2 and the effective area of the metal-semiconductor contact region 7 becomes small. Therefore, the area of the metal-semiconductor contact region 7 can be made larger than that for the case not provided with the n-type region 41, and the yield can be increased. In other words, negative resistance is provided even with a larger area of the metal-semiconductor contact region than that for the case of a simple metal-semiconductor contact.

Further, due to the existence of the reversely biased n-type region 41 as shown in FIG. 4, the equipotential surfaces in the substrate (shown by dotted lines) are formed from the neighborhood of the metal-semiconductor contact region 7 toward the lower surface of the n-type region 41. As a result, a carrier path 42 orthogonal to the equipotential surfaces is shifted deep in the substrate 2 compared with the case having no n-type region 41. Namely, when the area of the metal-semiconductor contact 7 forming an ohmic contact is made small compared with the area of the n-type injection region 3, the concentration of the electric field becomes remarkable in the neighborhood of the metal-semiconductor contact 7 by the injection of carriers from the n-type region 3 and by the fact that the depletion layer of the blocking junction consisting of the n-type region 41 and the semiconductor substrate 2 extends mainly into the semiconductor substrate. Thus, the avalanche phenomenon occurs at a low voltage application and the conductivity of the high resistivity region between the two n-type region 3 and 41 is subjected to a change to exhibit negative resistance between the lead wires 6 and 6*a*. Namely, a filament-like current path in the plasma state is formed and a much higher sensitivity for a magnetic field is provided in this element than that for elements generating no negative resistance. For example, in an element using p-type silicon of a specific resistivity of about 1,000 Ω-cm for the semiconductor substrate, and aluminum evaporation film for the metal electrodes 6 and 6*a*, when the distance from the n-type region 3 to the metal-semiconductor contact 7 is 100 μ and the area of the n-type region 3 is 300 μ in diameter, negative resistance cannot be generated if the area of the metal-semiconductor contact 7 is approximately equal to that of the n-type region 3, but is obtained in a low voltage and low current region if the area of the metal-semiconductor contact 7 is sufficient small. In this case, the breakdown voltage and the current at the breakdown can be selected appropriately by changing the specific resistivity of the substrate 2 and the shape and dimensions of the element.

Figure 5:
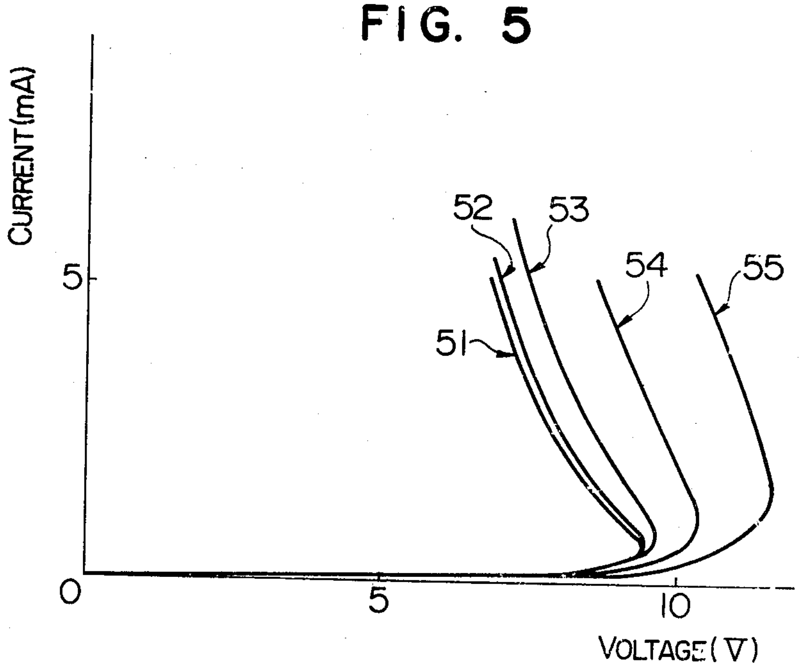
FIG. 5 shows the current vs. voltage characteristic curves of the element of FIG. 4 for several intensities of magnetic field.
Figure 6:
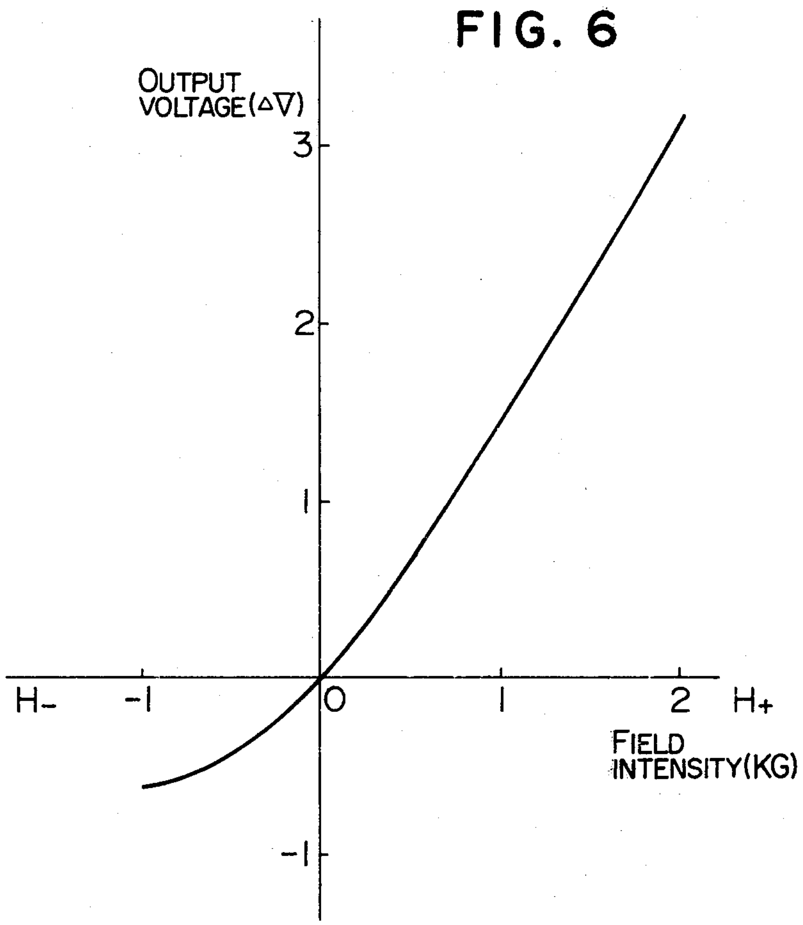
FIG. 6 shows the output voltage vs. field intensity curve of the element of FIG. 4.

FIGS. 5 and 6 show the field sensitivity characteristics of the element of said condition in which the area of the n-type region 41 is $100 \times 300\ \mu^2$, the area of the metal-semiconductor contact 7 is a half area of 60 μ in diameter, the area of the contact of the metal with the n-type region 41 is a half area of 60μ in diameter and the area of the n-type region 3 is 300 μ in diameter. In FIG. 5, the respective curves show the current I vs. voltage V characteristics of the element. Negative resistance of the current controlled type is observed. This negative resistance is due to the avalanche breakdown in the semiconductor substrate 2 in the neighborhood of the metal-semiconductor contact 7. The current path is shifted into a deeper portion in the substrate 2 due to the existence of the reversely biased blocking junction. As a result, when a magnetic field is applied to the element of FIG. 4 in a direction perpendicular to the drawing sheet and in a sense from the front to the back side of the sheet ($H_-$), the carrier path is shifted nearer to the substrate surface as shown by the arrow 43, hence the path length *l* decreases and the resistance of the element decreases. On the other hand, when the sense of the magnetic field is reversed, i.e., $H_+$ from the back to the front side of the sheet, the carrier path is shifted farther from the substrate surface as shown by the arrow 44, hence the path length *l* increases and the resistance of the element increases. In FIG. 5, curves 51 and 52 represent the characteristics for the application of a magnetic field $H_-$ of 2 KG and 1 KG perpendicular to and from the front to the back side of the sheet, curve 53 represents the characteristic in the absence of a magnetic field, and curves 54 and 55 represent the characteristics under the application of a magnetic field $H_+$ of 1 KG and 2 KG from the back to the front side of the sheet.

Comparing the present element of FIG. 4 having the characteristics of FIG. 5 with the conventional PIN type magnetic diode using a high resistivity silicon doped with a deep-level-forming impurity, such as Au, Ni, or Zn, as the substrate and exhibiting negative resistance, the present element can be characterized by the following two points; (1) a high field sensitivity is provided even for low magnetic fields from 0 to 1 KG, and (2) a negative magnetic field effect, i.e., decrease in the resistance by the application of a magnetic field, is provided.

The element of FIG. 4 is characterized by the provision of the blocking junction 41 to be biased reversely for providing a magneto-electrical transducer element having said two features. The effect of such a blocking junction can be made clearer from the changes in the characteristics of the element of FIG. 4 by the application of a magnetic field.

FIG. 6 shows the changes Δ V in the output voltage by the application of a magnetic field when the operation point if set at a current of 3 mA in the characteristic curve 53 in FIG. 5 and a load resistance of 2.2 Kω is connected. In this figure, it is to be noted that with a magnetic field in the direction of $H_-$, i.e., in the direction to bring the current path nearer to the substrate surface, the voltage at the operating point first decreases with the increase in the field intensity, but then the rate of change becomes saturated as the field intensity becomes large. When the field intensity is increased further, the rate of change becomes smaller, i.e., the resistance increases. Such change in the characteristic in the $H_-$ direction is not preferable in a magneto-electric transducer element. The element, however, has a high sensitivity for a magnetic field $H_+$ of 0 to 2 KG. Thus, various applications are possible. Further, if a bridge is formed using this element, a magneto-resistance element having a good linear field sensitivity in the range of about ± 2KG can be made.

Figure 7:
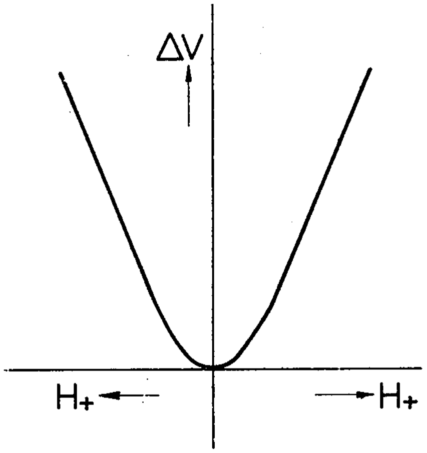
FIG. 7 shows the characteristic curve of the element of FIG. 4 but dispensed with the blocking junction.

An element as shown in FIG. 4 but without the blocking junction 41 has a different characteristic from that of FIG. 6, i.e., the characteristic as shown in FIG. 7. In FIG. 7, the output voltage at the operating point changes in proportion to the square of the field intensity in the low magnetic field region and linearly with the field intensity in the high magnetic field region in approximately a symmetric shape with respect to the magnetic field of $H_-$ and $H_+$. Such a characteristic, as shown in FIG. 7, resembles that of the usual PIN type magnetic diodes. Namely, in the usual PIN diode, when the current path is brought into the neighborhood of the substrate surface, carrier recombination increases in the neighborhood of the surface and the resistance also increases similar to the case of elongating the current path by bringing the current path farther from the substrate surface. Thus, a characteristic as shown in FIG. 7 is provided. In the element of FIG. 4, however, it can be considered as follows. Because of the existence of the n-type region 41, the depletion layer extends remarkably deeply into the substrate. Therefore, the decrease in the resistance due to the shrinking of the current path overcomes the increase in the resistance due to the recombination of carriers to exhibit the characteristic of FIG. 6. As is apparent from the comparison of FIG. 6 with FIG. 7, in the element structure of FIG. 4, the provision of the n-type region 41 gives effects similar to giving a magnetic bias to the element. Although the provision of the n-type region 41 in the element of FIG. 4 is necessary also for lowering the breakdown voltage and the operating point of the element, it is needed for achieving an equivalent state to a magnetically biased state as the result of shifting the carrier path in the absence of a magnetic field deeper into the substrate due to the existence of the above-mentioned depletion layer.

In short, the semiconductor magneto-resistance element of FIG. 4 is characterized by providing a reversely biased blocking junction in the neighborhood of the current path in the element for achieving equivalently a magnetically biased state as described above. From FIG. 4, it is understood that the potential distribution of the voltage applied between the electrodes 5 and 5*a* is changed by extending the depletion layer to shift the current path deeper into the substrate.

Figure 8:
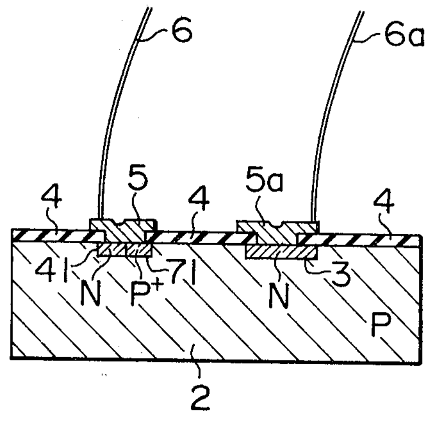
FIG. 8 is an enlarged cross-section of another embodiment of a semiconductor magneto-resistance element according to this invention.

Here, it was found that in the element of the above structure, similar negative resistance and similar field sensitivity could be obtained also when a p-type region 71 was formed by diffusing boron, etc. into the substrate 2 for avoiding the direct contact of the metal and the p-type high resistivity silicon, as is shown in FIG. 8.

Figure 9:
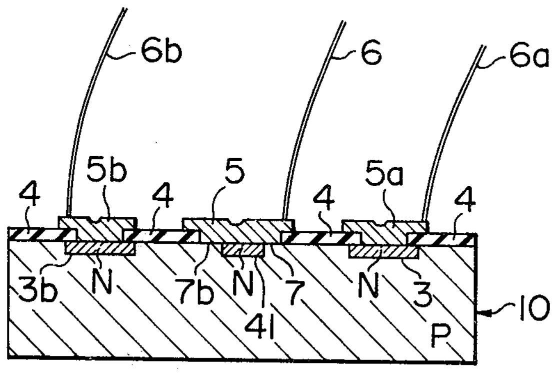
FIG. 9 is an enlarged cross-section of another embodiment of a semiconductor magneto-resistance element according to this invention.

FIG. 9 shows another embodiment of the present invention, which effectively utilizes said feature that the resistance of the element increases or decreases by the reversal of the magnetic field. This element utilizes the phenomenon of the magneto-resistance element of FIG. 4 skilfully and has improved further the field sensitivity, the temperature dependance and the linearity of the magnetic field vs. output voltage characteristic. Further, this magneto-resistance element shown in FIG. 9 can be made by completely the same manufacturing steps as those for said magneto-resistance element of FIG. 4. As is shown in FIG. 9, this element is characterized by providing n-type (injection) regions 3 and 3*b* in the same substrate symmetrically about an n-type (blocking junction) region 41. In the figures, similar parts are denoted by similar numerals. Numerals 5, 5*a*, and 5*b* represent metal electrodes, 6, 6*a*, and 6*b* lead wires, and 7 and 7*b* metal semiconductor contacts.

When a voltage is applied to the element of this structure, i.e., a positive voltage to the lead wire 6 and a negative voltage to a lead wire 6*a*, characteristics similar to those of the element of FIG. 4 are provided. Similarly, when a positive voltage is applied to the lead wire 6 and a negative voltage to the lead wire 6*b*, similar characteristics are provided. Further, since the n-type regions 3 and 3*b* being symmetric with respect to the n-type region (blocking junction region) 41 can be made simultaneously in the manufacturing steps of the element, for example according to the planar method, the characteristics which are provided between the terminals 6 and 6*a* and between the terminals 6 and 6*b* can be relatively easily made similar.

Figure 10:
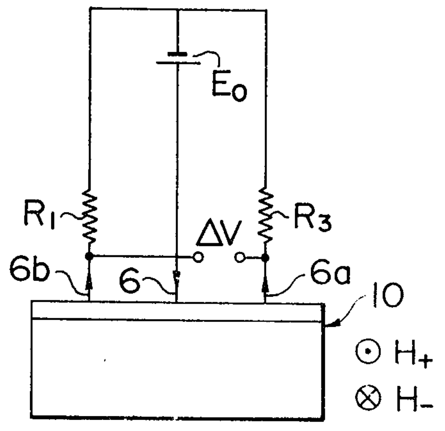
FIG. 10 shows an electrical connection diagram for the element of FIG. 9 in use.
Figure 11:
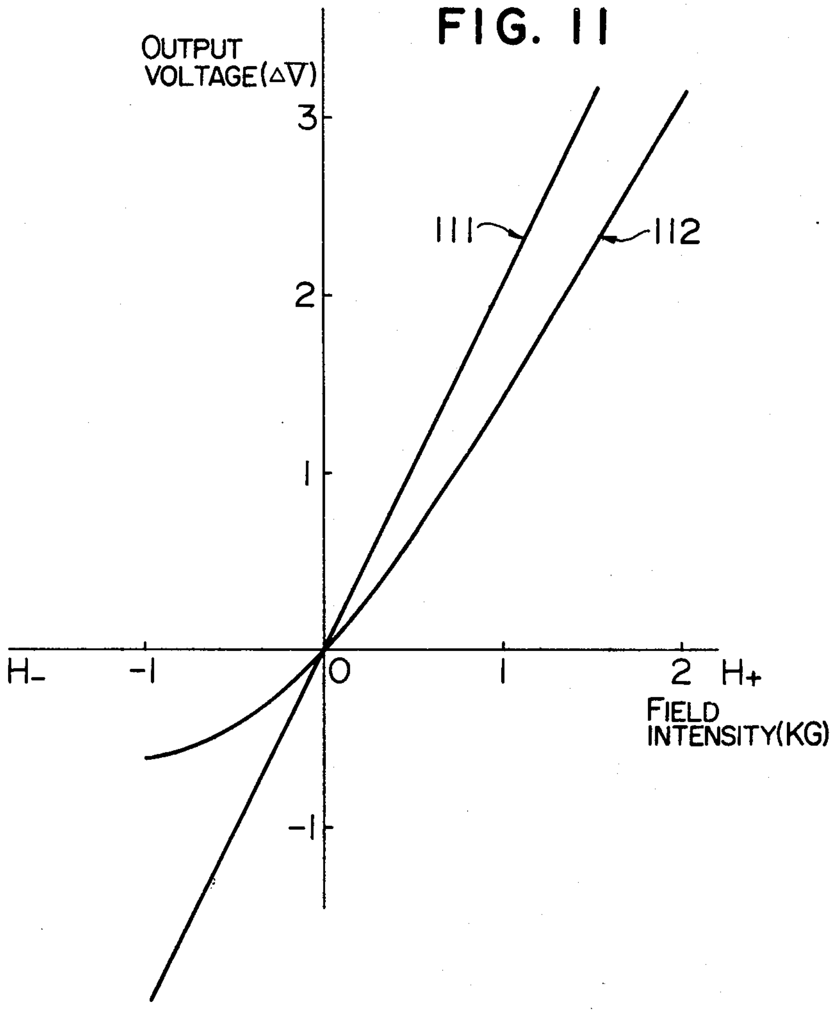
FIG. 11 shows the output voltage vs. field intensity characteristic curves for the elements shown in FIGS. 4 and 9.

The element 10 of the above structure may be connected with a dc voltage source $E_o$ and resistances $R_1$ and $R_3$, as is shown in FIG. 10. When a magnetic field is applied perpendicularly to the sheet in FIG. 10, the characteristic of the output voltage Δ V vs. the applied magnetic field as shown by curve 111 in FIG. 11 is obtained. The curve 111 shows an extremely good linearity and a high sensitivity for a magnetic field. Further, since the thermal coefficients of the resistance between the terminals 6 and 6*a*, and between 6 and 6*b* are substantially equal due to the symmetry, superior characteristics can be obtained over a wide temperature range. In FIG. 11, the characteristic of the output voltage Δ V vs. the applied magnetic field H between the two terminals, i.e., that of the element of FIG. 4, is also shown by curve 112 for the purpose of comparison. Zero point adjustment in the output voltage in the absence of a magnetic field can be made by adjusting the resistance $R_1$ and/or $R_3$ in FIG. 10.

Figure 12:
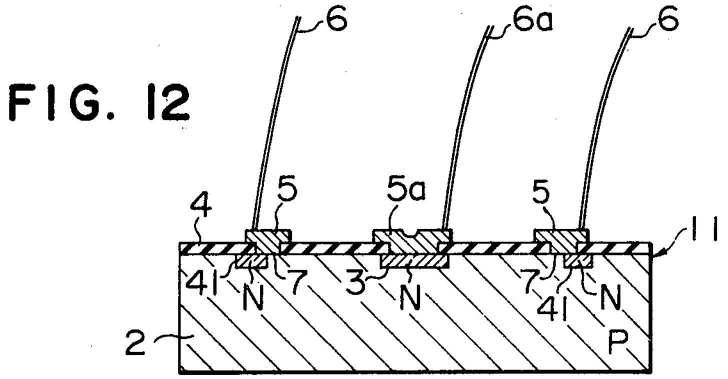
FIG. 12 is an enlarged cross-section of a modification of the element shown in FIG. 9 having similar characteristics.
Figure 13:
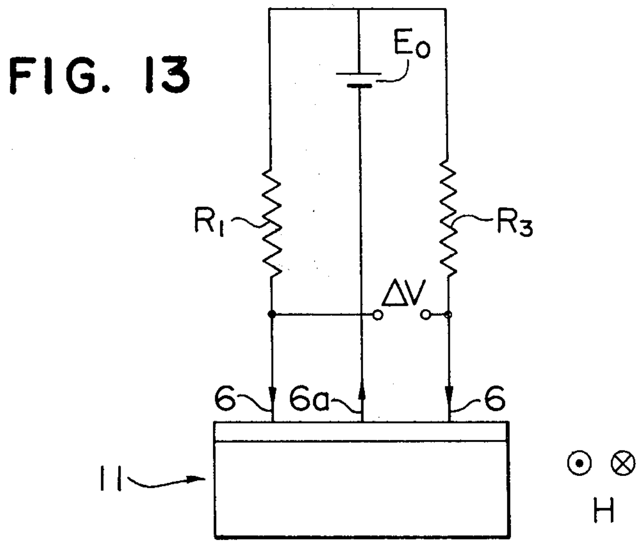
FIG. 13 shows an electrical connection diagram for the element of FIG. 12 in use.

A similar characteristic to that of FIG. 11 can also be achieved by the structure of an element 11 shown in FIG. 12, in which metal-semiconductor contacts 7 and n-type regions (blocking junction regions) 41 are formed symmetrically about an n-type injection region 3. When this element shown in FIG. 12 is connected as is shown in FIG. 13, similar characteristics to those shown in FIG. 11 are provided.

Similar to the case of FIGS. 4 and 8, for avoiding the direct contact of the metal electrode 5 and the p-type semiconductor substrate 2, p-type regions of lower resistivity may be formed in the substrate 2, for example by diffusing boron, in the elements of FIGS. 9 and 12. In such cases, the elements also show characteristics similar to those shown in FIG. 11.

All of the elements described in the foregoing have a negative resistance characteristic. Namely, they utilize the field concentrating effect of the metal-semiconductor contact positively. The element of FIG. 1 utilizes a negative resistance and those of FIGS. 4 and 8 further utilize the shift of the current path due to the formation of the n-type blocking junction region 41 to add a negative field effect. The elements of FIGS. 9 and 12 have not only a negative resistance characteristic and a negative field effect, but also a high sensitivity with good thermal characteristic and good linearity.

Here, said negative field effect and said negative resistance are mutually independent. For simply providing a negative magnetic field effect, the area of the metal-semiconductor contact 7 need not be made small.

Figure 14A:
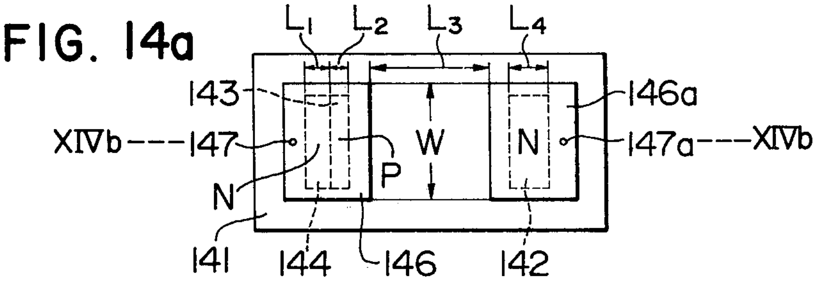
FIGS. 14*a* and 14*b* are an enlarged plan view and an enlarged cross-section of another embodiment of a semiconductor magneto-resistance element according to this invention.
Figure 14B:
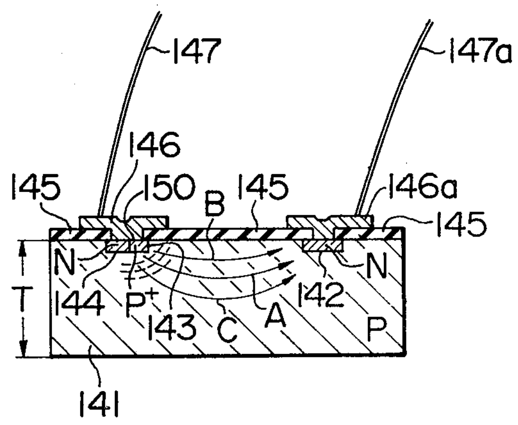

Another embodiment of the semiconductor magneto-resistance element according to this invention based on the above concept is shown in FIGS. 14*a* and 14*b*. This element can also be made by the planar method. Namely, an n-type injection region 142 and another n-type (blocking junction) region 144 are formed in a p-type semiconductor substrate 141 of high specific resistivity by diffusion. In the figures, numeral 145 denotes an oxide film, 146 and 146*a* metal electrodes, 147 and 147*a* lead wires derived from the metal electrodes 146 and 146*a*. A voltage is applied to this material so as to inject carriers from the n-type region 142, i.e., a positive potential to the lead 147 and a negative potential to the lead 147*a*. Then, due to the existence of the n-type blocking region 144, a depletion layer extends deeply into the semiconductor substrate 141. Equipotential surfaces are formed as is shown by the dotted lines in the depletion layer in FIG. 14*b*. As a result, the carrier path is formed at a position deeper in the substrate compared to the case of no blocking region even in the absence of a magnetic field. Thus, when a magnetic field $H_-$ is applied from the front to the back side of the FIG. 14*b*, the carrier path is shifted nearer to the substrate surface as is shown by curve B to decrease the resistance, and when a magnetic field $H_+$ is applied from the front to the back side of FIG. 14*b*, the carrier path is shifted farther from the substrate surface as is shown by curve C to increase the resistance.

Figure 15:
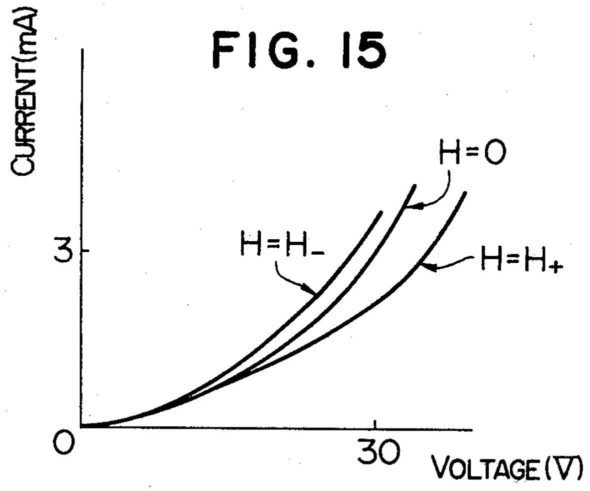
FIG. 15 shows the current vs. voltage characteristic curves of the element of FIG. 14 for several intensities of magnetic field.
Figure 16:
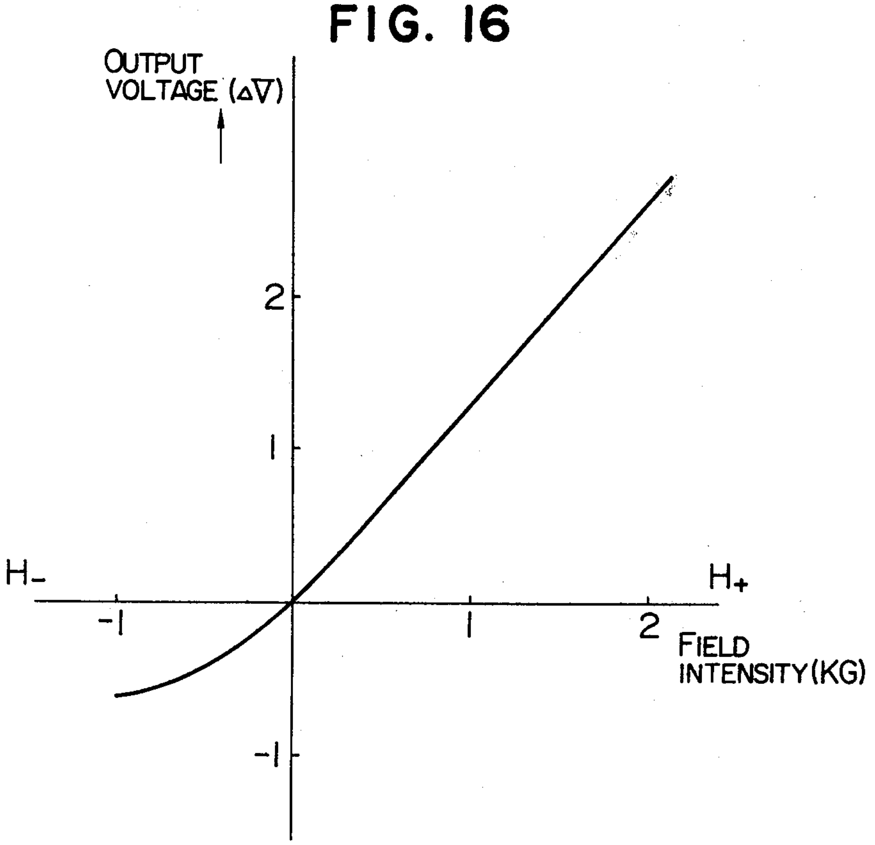
FIG. 16 shows the output voltage vs. field intensity characteristic curve of the element shown in FIG. 14.

FIGS. 15 and 16 show the magnetic field characteristics of the element of FIG. 14 having such a structure that a p-type silicon of a specific resistivity of 1,000 Ω cm is used as the substrate, $L_1 = 100\ \mu$ long, $L_2 = 50\ \mu$ long, $L_3 = 200\ \mu$ long, $L_4 = 100\ \mu$ long, $W = 300\ \mu$ wide, and $T = 200\ \mu$ thick. FIG. 16 shows the output voltage vs. magnetic field characteristic when the current is 3 mA and the load resistance is 2.2 KΩ in the characteristics of FIG. 15.

The element of FIG. 14 is more or less inferior to, for example, the element of FIG. 8 in field sensitivity due to the lack of the negative resistance characteristic. But it has a negative magnetic field effect and does not utilize the avalanche phenomenon, thereby the area of the metal-semiconductor contact need not be made small as is the case with the structure of FIG. 8. Thus, it is hardly affected by the external atmosphere and can have a high reliability. As described above, the p-type region 143 can be dispensed with. Yet further, it is apparently possible to form the element of FIG. 14 as is shown in FIGS. 9 and 12.

Although the description has been made of elements using a p-type silicon substrate, similar elements can be formed with an n-type silicon substrate. Here in the case of using an n-type silicon substrate in the structure having a direct contact of a metal electrode with a high resistivity substrate, it is necessary to use Al, Zn, Cd, Sn, AuSb, etc., as the metal forming an ohmic contact with the n-type high resistivity silicon.

We claim:

1. A semiconductor magneto-resistance element comprising:

a semiconductor substrate of one conductivity type;

first and second carrier injecting regions of the other conductivity type formed separately in said substrate;

first and second electrodes contacting said first and said second carrier injecting regions, respectively;

a blocking junction region of said other conductivity type formed in a predetermined portion of said substrate; and a third electrode formed on and contacting said substrate and said blocking junction region.

2. A semiconductor magneto-resistance element according to claim 1, further comprising a low resistivity region formed in the substrate at least in the contact portion between said third electrode and said substrate.

3. A semiconductor magneto-resistance element comprising:

a semiconductor substrate of one conductivity type;

a carrier injecting region of the other conductivity type formed in a predetermined portion of said substrate;

first and second blocking junction regions of said other conductivity type formed in predetermined portions of said substrate sandwiching said carrier injecting region;

a first electrode formed on and contacting said carrier injecting region; and second and third electrodes formed on and contacting said first and said second blocking junction regions and said substrate.

4. A semiconductor magneto-resistance element according to claim 3, further comprising low resistivity regions of said one conductivity type formed at least in the contact region of said second and said third electrodes with said semiconductor substrate, respectively.

5. A semiconductor magneto-resistance element comprising:

a semiconductor substrate of one conductivity type;

a region of the other conductivity type to that of said substrate formed in said substrate for injection carriers;

a first and a second electrode only, said first electrode being disposed on and contacting said carrier injecting region and said second electrode being disposed on said substrate and having a smaller ohmic contact area with said substrate than that of said first electrode with said carrier injecting region; and means for applying a voltage between said first and second electrodes to forwardly bias said carrier injection region and said substrate, thereby causing an avalanche phenomenon due to concentration of an electric field in the vicinity of said second electrode to produce a filamentary path of plasma current in said substrate between said first and second electrodes, the length of said plasma current path being varied by application of a magnetic field perpendicular to said current path.

6. A semiconductor magneto-resistance element according to claim 5, further comprising another region of said one conductivity type having a lower resistivity than that of said substrate and formed in the substrate at a portion between said second electrode and said substrate.

7. A semiconductor magneto-resistance element comprising:

a semiconductor substrate of one conductivity type;

a region of the other conductivity type to that of said substrate formed in said substrate for injecting carriers;

a first electrode disposed on and contacting said carrier injecting region;

a blocking junction region of the other conductivity type in a predetermined portion of said semiconductor substrate;

a second electrode disposed on said substrate and having a smaller contact area with said substrate than that of said first electrode with said carrier injecting region and contacting at least one portion of said substrate and said blocking junction region at said contact area thereof; and means for applying a voltage between said first and second electrodes to forwardly bias said carrier injection region in said substrate, whereby an avalanche phenomenon is caused due to concentration of an electric field in said substrate in the vicinity of said second electrode to provide a filamentary plasma current path in said substrate between said first and second electrodes, the length of said plasma current path being varied by application of a magnetic field perpendicular to said current path, a depletion layer being produced when a reverse bias is applied by said voltage applying means between said blocking junction region and said substrate, said depletion layer extending from the contact area of said second electrode deeply into the substrate thereby shifting said plasma current path in a direction away from the substrate surface.

8. A semiconductor magneto-resistance element according to claim 7, further comprising a low resistivity region of said one conductivity type formed in the substrate adjacent to said blocking junction region at least in the contact portion between said second electrode and said substrate.

9. A semiconductor magneto-resistance element comprising:

a semiconductor substrate of one conductivity type;

a first carrier injecting region of the other conductivity type to that of said substrate formed in a part of said substrate;

a second carrier injecting region of said one conductivity type formed in another part of said substrate;

a first electrode formed on and contacting with said first carrier injecting region;

a blocking junction region of the other conductivity type formed in a predetermined portion of said semiconductor substrate for altering the path for carriers injected from said carrier injecting regions;

a second electrode formed on said substrate and contacting with said second carrier injecting region and said blocking injection region, said second electrode having a relatively large contact area with said substrate; and means for applying a voltage between said first and second electrodes to forwardly bias said carrier injecting regions and said substrate, thereby establishing a current path in the substrate between said first and second electrodes, the length of said current path being varied by application of a magnetic field perpendicular to said current path, a depletion layer extending from the blocking region deeply into the substrate when a reverse bias is applied between the blocking region and the substrate by said voltage applying means to thereby shift the carrier path toward the depth of the substrate.

* * * * *